(12) United States Patent
Yamamoto et al.

(10) Patent No.: US 8,890,392 B2
(45) Date of Patent: Nov. 18, 2014

(54) PIEZOELECTRIC ACTUATOR HAVING A MOVEABLE ELECTRODE PORTION

(71) Applicants: Kansho Yamamoto, Nagaokakyo (JP); Teiji Yamamoto, Kyoto-Fu (JP); Ivo P. Koutsaroff, Nagaokakyo (JP)

(72) Inventors: Kansho Yamamoto, Nagaokakyo (JP); Teiji Yamamoto, Kyoto-Fu (JP); Ivo P. Koutsaroff, Nagaokakyo (JP)

(73) Assignee: Murata Manufacturing Co., Ltd., Nagaokakyo-Shi, Kyoto-fu (JP)

(*) Notice: Subject to any disclaimer, the term of this patent is extended or adjusted under 35 U.S.C. 154(b) by 0 days.

(21) Appl. No.: 13/656,800

(22) Filed: Oct. 22, 2012

(65) Prior Publication Data
US 2013/0043767 A1 Feb. 21, 2013

Related U.S. Application Data

(63) Continuation of application No. PCT/JP2011/058697, filed on Apr. 6, 2011.

(30) Foreign Application Priority Data

Apr. 23, 2010 (JP) ................................. 2010-099778

(51) Int. Cl.
*H01L 41/08* (2006.01)
*H01L 41/316* (2013.01)
(52) U.S. Cl.
CPC ............ *H04L 41/094* (2013.01); *H01L 41/316* (2013.01); *H04L 41/1873* (2013.01); *H04L 41/331* (2013.01)
USPC .......................................... 310/331; 310/328

(58) Field of Classification Search
CPC ..................................................... H01L 41/094
USPC ............................................ 310/328, 330–332
See application file for complete search history.

(56) References Cited

U.S. PATENT DOCUMENTS

| 5,966,787 | A | * | 10/1999 | Nakayama et al. | .......... 29/25.35 |
| 6,688,729 | B1 | * | 2/2004 | Imanaka et al. | ................ 347/48 |
| 6,700,309 | B2 | * | 3/2004 | Dausch et al. | ................ 310/330 |
| 7,098,577 | B2 | * | 8/2006 | Mehta | ........................... 310/332 |
| 7,173,602 | B2 | * | 2/2007 | Hasegawa et al. | ............ 345/107 |
| 7,345,404 | B2 | * | 3/2008 | Klee et al. | ..................... 310/330 |
| 7,372,191 | B2 | * | 5/2008 | Ohmori et al. | ................ 310/330 |

(Continued)

FOREIGN PATENT DOCUMENTS

| CN | 1609047 A | 4/2005 |
| JP | 2007-273800 A | 10/2007 |

(Continued)

OTHER PUBLICATIONS

PCT/JP2011/058697 Written Opinion dated May 6, 2011.

(Continued)

*Primary Examiner* — J. San Martin
(74) *Attorney, Agent, or Firm* — Dickstein Shapiro LLP (57) ABSTRACT

A piezoelectric actuator that includes a fixed electrode in a base substrate, a dielectric layer on the surface of the base substrate, a lower electrode that is at least partially separated from the base substrate, a piezoelectric layer on the surface of the lower electrode, and an upper electrode on the side of the surface of the piezoelectric layer. At least a portion of the upper electrode or the lower electrode serves as a movable electrode, which can be moved by distortion of the piezoelectric layer caused by application of a piezoelectric drive voltage.

17 Claims, 5 Drawing Sheets (56) References Cited

U.S. PATENT DOCUMENTS

| | | | |
|---|---|---|---|
| 7,420,320 B2* | 9/2008 | Sano et al. | 310/363 |
| 7,477,003 B2* | 1/2009 | Takayanagi et al. | 310/330 |
| 7,479,726 B2* | 1/2009 | Ohguro | 310/330 |
| 7,567,018 B2* | 7/2009 | Kawakubo et al. | 310/328 |
| 7,586,238 B2* | 9/2009 | Liu | 310/328 |
| 7,830,215 B2* | 11/2010 | Higuchi et al. | 331/158 |
| 8,102,098 B2* | 1/2012 | Nishigaki et al. | 310/332 |
| 8,274,200 B2* | 9/2012 | Zhang et al. | 310/330 |
| 2004/0214723 A1 | 10/2004 | Nonoyama et al. | |
| 2006/0119227 A1* | 6/2006 | Ikehashi | 310/348 |
| 2007/0069342 A1* | 3/2007 | Inaba | 257/666 |
| 2007/0209176 A1* | 9/2007 | Kawakubo et al. | 29/25.35 |
| 2007/0228887 A1 | 10/2007 | Nishigaki et al. | |
| 2008/0238257 A1 | 10/2008 | Kawakubo et al. | |
| 2008/0297972 A1 | 12/2008 | Matz | |
| 2009/0051251 A1 | 2/2009 | Kawakubo et al. | |

FOREIGN PATENT DOCUMENTS

| | | |
|---|---|---|
| JP | 2008-238330 A | 10/2008 |
| JP | 2008-258186 A | 10/2008 |
| JP | 2009-055683 A | 3/2009 |
| JP | 2009-118627 A | 5/2009 |
| JP | 2009-238546 A | 10/2009 |
| JP | 2009-256147 A | 11/2009 |
| JP | H05-231815 A | 9/2013 |

OTHER PUBLICATIONS

PCT/JP2011/058697 International Search Report dated May 6, 2011.
Japanese Office Action issued for counterpart application No. JP 2012-511604, dispatch date, Sep. 3, 2013 (with English translation).

* cited by examiner

PIEZOELECTRIC ACTUATOR HAVING A MOVEABLE ELECTRODE PORTION

CROSS REFERENCE TO RELATED APPLICATIONS

The present application is a continuation of International application No. PCT/JP2011/058697, filed Apr. 6, 2011, which claims priority to Japanese Patent Application No. 2010-099778, filed Apr. 23, 2010, the entire contents of each of which are incorporated herein by reference.

FIELD OF THE INVENTION

The present invention relates to a piezoelectric actuator that performs electrical control by using a piezoelectric material.

BACKGROUND OF THE INVENTION

Currently, various switching elements configured by MEMS elements have been designed. As disclosed in Patent Document 1, for example, some of these switching elements use a piezoelectric actuator.

In the switching element based on a piezoelectric actuator disclosed in Patent Document 1, a cantilever arm is attached to the surface of a base substrate. The arm includes a vertical wall portion serving as a cantilever support portion and having a wall surface orthogonal to the base substrate, and a horizontal wall portion supported by the vertical wall portion and having a wall surface parallel to the base substrate. A movable electrode is formed on the horizontal wall portion. Above the movable electrode, a fixed electrode is formed on the inner wall of a cover portion that covers the arm.

A lower electrode, a piezoelectric film, and an upper electrode are arranged in this order near the support side end of the horizontal wall portion of the arm. These components constitute a piezoelectric drive portion. When a drive voltage is applied between the lower electrode and upper electrode of the piezoelectric drive portion, the piezoelectric film is distorted, the arm bends upwards, and the movable electrode comes into close proximity to the fixed electrode. In this way, as the distance between the movable electrode and the fixed electrode varies depending on whether or not a drive voltage is applied, the switching element functions as a switch or a variable capacitance element.

Patent Document 1: Japanese Unexamined Patent Application Publication No. 2009-238546

SUMMARY OF THE INVENTION

In the switching element based on a piezoelectric actuator disclosed in Patent Document 1 mentioned above, the movable electrode, the arm, and the piezoelectric drive portion are formed separately. Therefore, there are a large number of components that constitute the switching element, which also increases the number of steps in the manufacturing flow for forming those individual components.

It is an object of the present invention to provide a piezoelectric actuator that can be formed by means of a simpler configuration and a simpler manufacturing flow than in the related art.

A piezoelectric actuator according to the present invention includes a base substrate that has an insulating property, a fixed electrode that is formed in the base substrate, a lower electrode, a piezoelectric layer, an upper electrode, and a movable electrode. The lower electrode is an electrode for applying a piezoelectric drive voltage which is at least partially separated from the base substrate. The piezoelectric layer is formed on a side of the lower electrode opposite to the base substrate. The upper electrode is an electrode for applying the piezoelectric drive voltage which is formed on a side of the piezoelectric layer opposite to the lower electrode. The distance of the movable electrode to the fixed electrode varies as the piezoelectric layer is distorted by application of the piezoelectric drive voltage. In this configuration, at least a portion of the movable electrode is formed by the upper electrode or the lower electrode.

According to this configuration, the movable electrode itself has the function of an arm that bends, and hence the configuration is simplified. Further, the upper electrode or the lower electrode is partially included in the movable electrode, which further simplifies the configuration. Also, the fixed electrode is provided to the base substrate. Thus, no cover is required for the function of the electrical circuit, which also leads to simplification of the configuration.

Also, in the piezoelectric actuator according to the present invention, one end of the movable electrode is supported by a stacked structure portion that includes the lower electrode, the piezoelectric layer, and the upper electrode.

This configuration illustrates a specific configuration of the support column for the movable electrode. In this way, the configuration according to the present invention can bring about desired changes in the movable electrode without separately providing an arm in addition to the movable electrode.

Also, in the piezoelectric actuator according to the present invention, the movable electrode is formed by the upper electrode.

According to this configuration, the upper electrode doubles as the movable electrode, and also serves as an arm that bends. The configuration is further simplified as a result. Also, the upper electrode is formed later in the manufacturing flow than the piezoelectric layer, and hence not affected by the manufacturing process conditions applied to the piezoelectric layer. Therefore, the range of choices for the material of the movable electrode that doubles as the upper electrode increases. Accordingly, a suitable material can be easily selected in accordance with the product specifications, cost, and so on.

Also, in the piezoelectric actuator according to the present invention, a dielectric layer is formed between the fixed electrode and the movable electrode.

According to this configuration, as the specific structure of the piezoelectric actuator, a dielectric layer is provided between the fixed electrode and the movable electrode. The presence of this dielectric layer ensures that the fixed electrode and the movable electrode do not come into direct contact with each other. Therefore, the piezoelectric actuator can be used both as, for example, a high frequency switch for frequencies in the range of 50 MHz to 10 GHz, and as a high frequency capacitance element. Also, as compared with a case where the fixed electrode and the movable electrode are directly in contact with or close proximity to each other, the provision of the dielectric layer between these electrodes reduces the possibility of fusion upon passage of an excessively large signal, thereby keeping the movable electrode separated in a stable manner even after application of a drive voltage. Thus, a switching operation becomes possible. Even though such a dielectric layer is provided, the configuration of the other components is simplified. Thus, the configuration of the piezoelectric actuator including the dielectric layer can be made simpler than in the related art.

Also, in the piezoelectric actuator according to the present invention, the dielectric layer is formed by the piezoelectric layer.

According to this configuration, the piezoelectric layer is made to double as the dielectric layer. Thus, the piezoelectric actuator including the dielectric layer can be realized by means of an even simpler configuration.

Also, in the piezoelectric actuator according to the present invention, the area of the movable electrode which is located in close proximity to the fixed electrode varies with the amount of distortion of the piezoelectric layer.

According to this configuration, the variations in the area in close proximity to the fixed electrode make it possible to realize multiple different capacitances that vary in a continuous or multistep manner. Thus, a variable capacitance element can be configured. Even such a piezoelectric actuator that serves as a variable capacitance element can be realized by means of a simpler configuration than in the related art.

Also, in the piezoelectric actuator according to the present invention, the fixed electrode and the movable electrode are connected to a transmission line that transmits a high frequency signal, or are connected between the transmission line and a ground line.

According to this configuration, the electrode for applying a drive voltage is made to double as the movable electrode for high frequency signals, thereby achieving more simplified structure than the structure according to the related art in which the arm and the movable electrode are formed separately. Thus, miniaturization is possible when using the piezoelectric actuator as a high frequency switch or a variable capacitance element.

Also, in the piezoelectric actuator according to the present invention, the piezoelectric layer is formed of a lead zirconate titanate, aluminum nitride, or zinc oxide material.

This configuration illustrates specific materials for the piezoelectric layer. Use of these materials enables easy manufacture, and proves advantages for the piezoelectric actuator according to the present disclosure.

Also, in the piezoelectric actuator according to the present invention, the piezoelectric layer is formed of a potassium sodium niobate material.

This configuration illustrates another specific example of the material that forms the piezoelectric layer. Since this material exhibits excellent piezoelectricity among non-lead piezoelectric materials, it is possible to configure a piezoelectric actuator that achieves both excellent environmental properties and piezoelectricity. The piezoelectric constant $d_{31}$ of the potassium sodium niobate system is in the range of 50 to 150 pm/V.

At this time, the potassium sodium niobate system includes a potassium sodium niobate material represented by General Formula (1) below, or a potassium sodium niobate material having not more than 10 mol % of at least one kind of metal or oxide selected from the group consisting of Mn, Mg, Zn, Fe, Cu, and Yb added to General Formula (1).

General Formula (1):

(where A is at least one compound selected from the group consisting of Li, Ag, Ca, Sr, Bi, and Gd, B is at least one compound selected from the group consisting of Ta, Zr, Ti, Al, Sc, and Hf, and a, b, and c are in ranges of $0 \leq a \leq 0.9$, $0 \leq b \leq 0.3$, $0 \leq a+b \leq 0.9$, and $0 \leq c \leq 0.3$.)

Also, in the piezoelectric actuator according to the present invention, the fixed electrode is embedded in the base substrate.

This configuration illustrates a specific example of the configuration of the fixed electrode. By embedding the fixed electrode in the base substrate in this way, the piezoelectric layer and the dummy layer formed on the fixed electrode can be easily formed flat.

Also, in the piezoelectric actuator according to the present invention, the substrate is made of LTCC, glass, SOI, alumina ceramics, $LiNbO_3$, $LiTaO_3$, quartz crystal, Si, sapphire, GaAs, GaN, Ge, or SiC.

This configuration illustrates a specific example of the configuration of the base substrate. As the base substrate for thin-film electrodes, like the above-mentioned materials, a material that is subject to small thermal contraction and has a thermal expansion coefficient close to that of the piezoelectric layer is preferred because such a material makes warping or deformation of the movable electrode smaller.

Also, the present invention relates to a manufacturing method for a piezoelectric actuator. This manufacturing method for a piezoelectric actuator includes the steps of: (1) forming a fixed electrode in a base substrate that has an insulating property; (2) forming a dummy layer on a side of the base substrate where the fixed electrode is formed; (3) forming a lower electrode so that at least a portion of the lower electrode is arranged on a side of the dummy layer opposite to the base substrate; (4) forming a piezoelectric layer on a side of the lower electrode opposite to the base substrate; (5) forming an upper electrode on a side of the piezoelectric layer opposite to the lower electrode; and (6) forming a movable electrode by removing the dummy layer.

According to this manufacturing method, the movable electrode is formed after formation of the piezoelectric layer, thereby reducing limitations in the range of choices for the material of the movable electrode. Specifically, in a case where the piezoelectric layer is formed of the above-mentioned lead zirconate titanate system or potassium sodium niobate system with large piezoelectricity, the temperature of the deposition process becomes as high as 500° C. to 700° C. Therefore, when attempting to form the movable electrode before formation of the piezoelectric layer, its material is limited to those materials which do not undergo transformation or deformation at the corresponding process temperature. However, forming the movable electrode after formation of the piezoelectric layer eliminates such restrictions imposed by the process temperature. Thus, the range of choices for the material of the movable electrode can be increased.

Also, in the piezoelectric actuator according to the present invention, in the step of forming the dummy layer, a zinc oxide is used for the dummy layer.

According to this manufacturing method, owing to the orientation of the zinc oxide used for the dummy layer, the crystallinity of the lower electrode in contact with the dummy layer and the piezoelectric layer in close proximity to the dummy layer via the lower electrode improves. Thus, a piezoelectric actuator with excellent reliability and piezoelectric characteristics can be configured.

According to the present invention, a piezoelectric actuator can be formed by means of a simpler configuration and a simpler manufacturing flow than in the related art.

DETAILED DESCRIPTION OF THE PREFERRED EMBODIMENTS

Figure 1A:
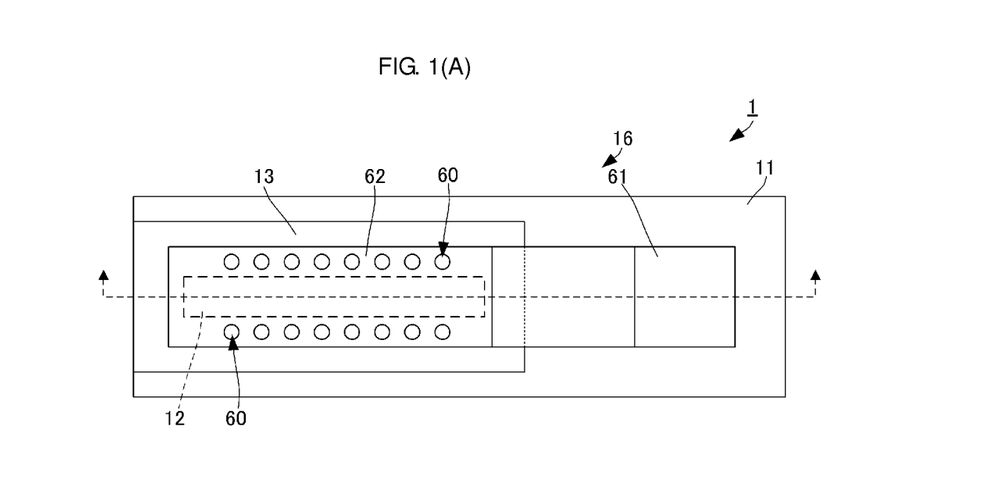
FIGS. 1(A) and 1(B) illustrate a plan view and a side cross-sectional view of a piezoelectric actuator 1 according to a first embodiment.
Figure 1B:
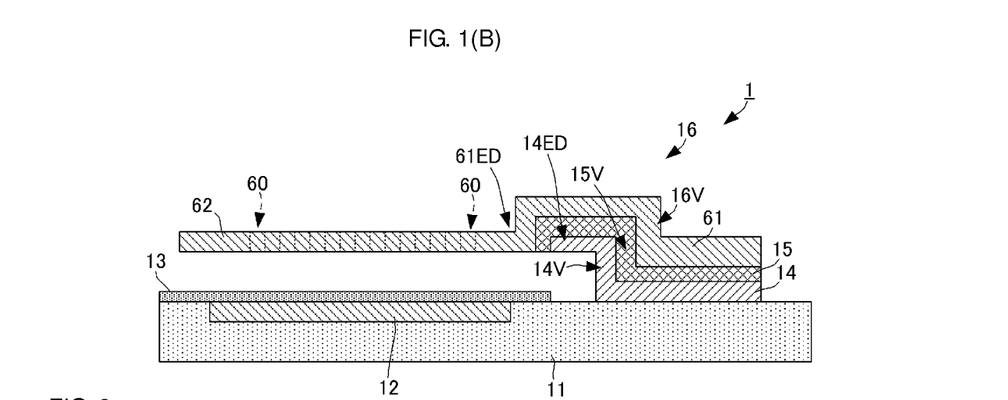
Figure 2:
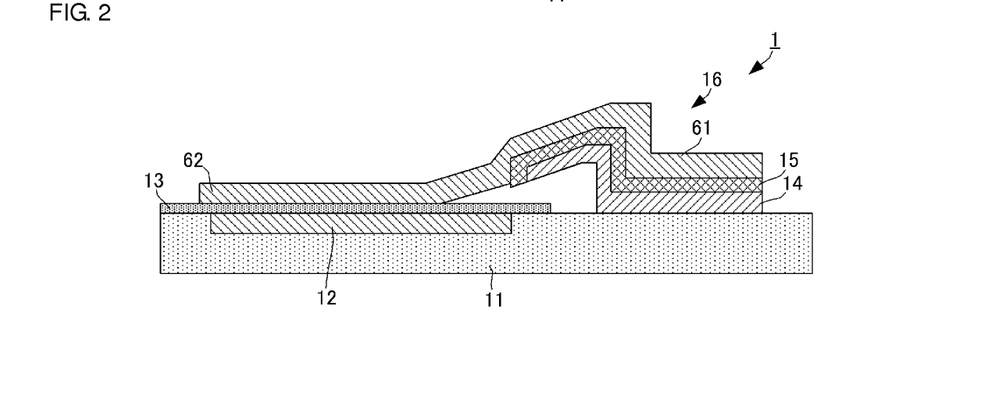
FIG. 2 is a side cross-sectional view of a movable portion of the piezoelectric actuator 1 according to the first embodiment in a bent state.

A piezoelectric actuator according to a first embodiment of the present invention is described with reference to the drawings. FIG. 1(A) is a plan view of a piezoelectric actuator 1 according to this embodiment, and FIG. 1(B) is a side cross-sectional view of the same. FIG. 2 is a side cross-sectional view of the movable portion of the piezoelectric actuator 1 in a bent state.

(Structure of Piezoelectric Actuator)

As illustrated in FIG. 1(A), the piezoelectric actuator 1 has an insulating base substrate 11 with a predetermined area and a predetermined thickness. The base substrate 1 is formed with a length of 1.5 mm and a width of 0.5 mm in plan view, for example. A recess is formed in a predetermined region on one principal surface (top side in FIG. 1(B)) of the base substrate 11. A fixed electrode 12 is formed inside the recess.

A dielectric layer 13 is formed in a predetermined region on the surface (one principal surface) of the base substrate 11 where the fixed electrode 12 is formed, at a predetermined thickness so as to cover at least the fixed electrode 12.

A lower electrode 14 is formed at a predetermined thickness in a predetermined region on the surface of the base substrate 11. The lower electrode 14 has an upright bending portion 14V in its intermediate portion, and a portion 14ED of the lower electrode 14 is separated from the base substrate 11 by a predetermined distance. Although the bending portion 14V is upright in FIG. 1(B), the bending portion 14V is formed into a shape inclined at a predetermined angle (e.g., 45 degrees) in a manufacturing method described later. While the intermediate portion in which the bending portion 14V is provided may be any position in the lower electrode 14, the dimensions of the portion 14ED separated from the base substrate 11 are defined so that a predetermined piezoelectric drive is obtained.

A piezoelectric layer 15 is formed in a predetermined region and at a predetermined thickness so as to cover the lower electrode 14. Also, the piezoelectric layer 15 has a bending portion 15V that conforms to the bending portion 14V of the lower electrode 14. At this time, the piezoelectric layer 15 is formed so as to cover even the portion 14ED of the lower electrode 14 which is separated from the base substrate 11. This structure ensures separation between the lower electrode 14 and the upper electrode 16 when an upper electrode 16 described later is formed.

The upper electrode 16 is formed as an integrated structure of a support portion 61 and a movable portion 62. Although an end of the support portion 61 also bends as the piezoelectric layer 15 is distorted, for the convenience of explanation, the upper electrode 16 is divided into the support portion 61 and the movable portion 62 in the following description. The support portion 61 is formed in a predetermined region at a predetermine thickness so as to cover the piezoelectric layer 15. Also, the upper electrode 16 has a bending portion 16V that conforms to the bending portion 14V of the lower electrode 14, and the bending portion 15V of the piezoelectric layer 15. The movable portion 62 connects to an end 61ED of the support portion 61 not facing the lower electrode 14. As illustrated in FIG. 1(A), in plan view of the piezoelectric actuator 1, the movable portion 62 is formed at a predetermined thickness with an area such that the movable portion 62 faces at least the fixed electrode 12. The movable portion 62 has multiple through-holes 60 formed in a predetermined arrangement pattern. The provision of the through-holes 60 causes the cross-sectional area orthogonal to the longitudinal direction to differ between where the through-holes 60 exist and where the through-holes 60 do not exist. Therefore, the movable portion 62 is easily bent, effectively producing continuous or multistep variations in the movable portion 62 in a variable capacitance element described later. The multiple through-holes 60 may not necessarily be formed in an equidistant arrangement pattern but may be arranged in an arbitrary manner according to the bending of the movable portion 62, for example, in such a way that makes the arrangement pattern differ between the distal end side of the movable portion 62 and the side of the movable portion 62 close to the support portion 61. Since the main purpose of the through-holes 60 is to create variations in cross-sectional area, their shape may not be circular but may be elliptical or polygonal in plan view. Such holes may not be through-holes but may be semi-through holes. The through-holes 60 may not be provided as long as a desired piezoelectric drive can be attained.

Owing to the above-mentioned configuration, one end of the flat plate-shaped movable portion 62 of the upper electrode 16 is supported by a support column that is formed by a stacked structure of the support portion 61 of the upper electrode 16, the piezoelectric layer 15, and the lower electrode 14, so as to be separated from the surface of the base substrate 11 by a predetermined distance.

With this structure, when a drive voltage is applied between the upper electrode 16 and the lower electrode 14, the piezoelectric layer 15 is distorted, producing a bend in the portion from the vicinity of an end of the support column including the support portion 61 of the upper electrode 16, the piezoelectric layer 15, and the lower electrode 14 to the movable portion 62. Owing to this bend, as illustrated in FIG. 2, the movable portion 62 of the upper electrode 16 comes into contact with the surface of the dielectric layer 13 of the base substrate 11. Thus, the movable portion 62 of the upper electrode 16 and the fixed electrode 12 face each other via the dielectric layer 13. As a result, a capacitor defined by the facing area between the movable portion 62 of the upper electrode 16 and the fixed electrode 12, and the thickness and dielectric constant of the dielectric layer 13 is formed. The capacitance of the capacitor ranges from 0.01 pF to 10 pF.

When application of a drive voltage to the upper electrode 16 and the lower electrode 14 is stopped, distortion of the dielectric layer 15 due to the applied drive voltage is removed, causing the dielectric layer 15 to return from the bent state to its original unbent state. Thus, the movable portion 62 and the fixed electrode 12 become separated from each other via the dielectric layer 13 and a predetermined space gap.

Although not illustrated, a transmission line that transmits desired high frequency signals is connected to the upper electrode 16 and the fixed electrode 12. Owing to this structure, when a drive voltage is not being applied, the movable portion 62 of the upper electrode 16 and the fixed electrode 12 are separated from each other, not conducting high frequency signals. When a drive voltage is being applied, a capacitor with a predetermined capacitance is formed, resulting in a high frequency conducting state. Therefore, this structure allows the piezoelectric actuator 1 to function as a high frequency switch. Also, other than being connected to a transmission line that transmits high frequency signals, the piezoelectric actuator 1 can be also connected between the transmission line and a ground line to function as a switch.

At this time, as mentioned above, the upper electrode 16 for applying a drive voltage is made to double as a movable electrode for high frequency signals, thus enabling a more simplified structure than the structure according to the related art in which the arm and the movable electrode are formed separately. Also, the lower electrode 14, the piezoelectric layer 15, and the support portion 61 of the upper electrode 16 function as the support column for the arm, thus enabling a more simplified structure than the structure according to the related art in which the lower electrode 14, the piezoelectric layer 15, and the upper electrode 16 are provided after the arm is provided separately. Further, the fixed electrode 12 is provided to the base substrate 11, thus enabling a more simplified structure than in the case of separately providing the fixed electrode 12 to a cover or the like. As described above, the structure according to this embodiment makes it possible to form a piezoelectric actuator by means of a structure that is simpler than in the related art.

While the above description is directed to the case of controlling on/off of a high frequency switch by application and non-application of a drive voltage, the piezoelectric actuator can be also used as a variable capacitance element by adjusting the drive voltage level in a continuous or multistep manner.

That is, by adjusting the drive voltage level in a continuous or multistep manner, distortion of the piezoelectric layer 15 can be also adjusted in a continuous or multistep manner. When the degree of distortion of the piezoelectric layer 15 changes, the bent state also changes, and so does the area of contact of the movable portion 62 of the upper electrode 16 with the dielectric layer 13. A change in the contact area also causes a change in the capacitance value of the capacitor formed by the movable portion 62 of the upper electrode 16, the fixed electrode 12, and the dielectric layer 13. By controlling multiple such contact states, a capacitance value that varies in a continuous or multistep manner can be realized by means of a single piezoelectric actuator 1, thereby making it possible to use the piezoelectric actuator 1 as a variable capacitance element.

While the shape of the movable portion 62 is illustrated schematically in the above description, the following structure is more desirable. Specifically, the length of the movable portion 62 in side view is longer than the length of the fixed electrode 12 in side view, and the distal end side of the movable portion 62 does not overlap the fixed electrode 12 in plan view. Thus, even when the distal end side of the movable portion 62 hangs down under its own weight while no drive voltage is applied, or when the distal end side of the movable portion 62 abruptly comes into contact with the dielectric layer 13 due to unwanted sticking upon application of a drive voltage, the distal end side of the movable portion 62 does not come to face the fixed electrode 12 via the dielectric layer 13. Thus, the function as a switch or the function as a variable capacitance element mentioned above can be realized more reliably.

(Manufacturing Method for Piezoelectric Actuator 1)

Figure 3:
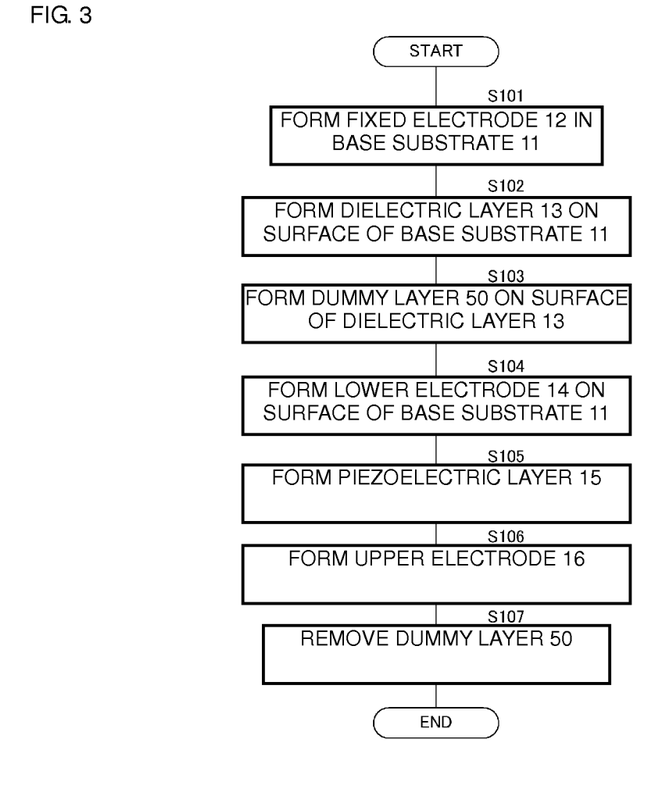
FIG. 3 is a flowchart showing a manufacturing flow for the piezoelectric actuator 1 according to the first embodiment.

Next, a manufacturing method for the piezoelectric actuator 1 according to this embodiment is described in detail with reference to the drawings. FIG. 3 is a flowchart illustrating a manufacturing flow of the piezoelectric actuator 1 according to the first embodiment. FIGS. 4(A) to 4(G) are side cross-sectional views illustrating a structure in each step of the flowchart illustrated in FIG. 3.

Figure 4A:
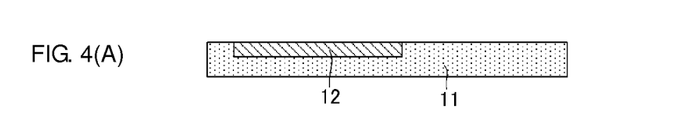
FIGS. 4(A) to 4(G) are side cross-sectional views illustrating a structure in each step of the flowchart illustrated in FIG. 3.

First, as illustrated in FIG. 4(A), for example, a recess of 500 nm to 5 µm (typically 3 µm) is formed by dry etching in the base substrate 11 made of a glass with a thickness of 100 µm to 500 µm (typically 300 µm), and the fixed electrode 12 made of Cu is formed by sputtering (S101). The method of forming the recess may be wet etching, sand blasting, or the like. Also, the method of forming the fixed electrode 12 may be evaporation or plating, or a combination of these methods. As the material of the base substrate 11, other than glass, an insulating material, a piezoelectric material, or a semiconductor material such as LTCC, SOI, alumina ceramics, $LiNbO_3$, $LiTaO_3$, quartz crystal, Si, sapphire, GaAs, GaN, Ge, or SiC may be used. Also, as the material of the fixed electrode 12, other than Cu, a metal with a high melting point or electrical conductivity such as Au, Ag, Pt, Ru, or Ir, a stacked electrode having multiple metals stacked on one another, a Cu alloy, or an Ag alloy such as Ag—Pd may be used.

Next, the surface on the fixed electrode 12 side of the base substrate 11 is flattened by a polishing process such as CMP. Thereafter, although not illustrated in this drawing, a barrier film of TiN, TaN, TiSiN, or the like may be formed on the Cu electrode by sputtering at a thickness of about 100 nm in order to prevent oxidation and diffusion of Cu or the like.

Figure 4B:
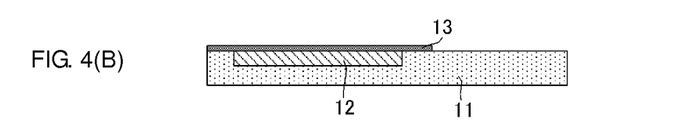

Next, as illustrated in FIG. 4(B), by using sputtering and at a deposition temperature of 100° C. to 700° C., the dielectric layer 13 made of $Ta_2O_5$ (dielectric constant: 25) is formed by patterning in a predetermined shape by dry etching, at a thickness of 100 nm to 1 µm (typically 200 nm) on the surface on the fixed electrode 12 side of the base substrate 11 (S102). The method of forming the dielectric layer 13 may be evaporation or plating, and the patterning may be a wet method. As the material of the dielectric layer 13, other than $Ta_2O_5$, a $SiN_x$, $SiO_2$, $Al_2O_3$, (Ba, Sr)TiO system (e.g., nitrogen doping) may be used. It is preferable to use a material with a dielectric constant of 5 to 1000, more preferably 20 to 150. The dielectric layer 13 may be formed as a multilayer structure by using multiple dielectric materials.

Figure 4C:
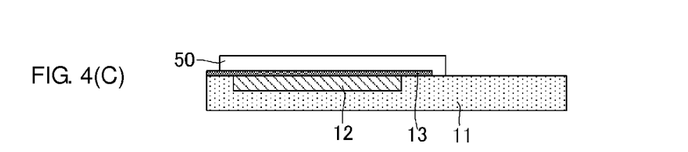

Next, as illustrated in FIG. 4(C), by using sputtering and at a deposition temperature of 100° C. to 700° C., a dummy layer 50 made of ZnO is formed by patterning in a predetermined shape by wet etching, at a thickness of 1 to 10 µm (typically 3 µm) on the surface of the dielectric layer 13 (S103). The method of forming the dummy layer 50 may be evaporation or plating, and the patterning may be dry etching. As the material of the dummy layer 50, other than ZnO, polysilicon or the like may be used. When ZnO is used for the dummy layer 50, the crystallinity of the lower electrode 14 and dielectric layer 15 that are formed in subsequent steps improves owing to orientation of the ZnO. Thus, the characteristics and reliability of the piezoelectric actuator 1 can be improved.

Figure 4D:
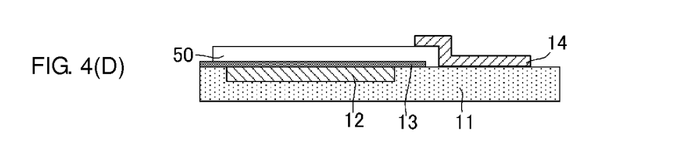

Next, as illustrated in FIG. 4(D), by using sputtering and at a deposition temperature of 100° C. to 700° C., the lower electrode 14 made of Pt is formed by patterning in a predetermined shape by dry etching, at a thickness of 100 to 500 nm (typically 200 nm) on the surfaces of the dummy layer 50 and base substrate 11 (S104). The method of forming the lower electrode 14 may be evaporation or plating, and the patterning may be wet etching. At this time, owing to the thickness of the dummy layer 50, the bending portion 14V is formed in the lower electrode 14, and the portion 14ED of the lower electrode 14 separated from the base substrate 11 is formed. As the material of the lower electrode 14, a material with a high melting point that is stable even under high temperatures is preferred. Other than Pt, the material may be Ir, Ru, or an oxide thereof, a conductive oxide nitride such as $LaNiO_3$, $SrRuO_3$, $SrIrO_3$, $SrCoO_3$, $LaTiO_2N_1$, $(Sr, La)TiO_xN_y$, or a stacked structure thereof. A titanium oxide material is preferably used as the underlying layer. Use of $LaNiO_3$, $SrRuO_3$, $LaTiO_2N_1$, and $(Sr, La)TiO_xN_y$ for the surface layer of the lower electrode 14 improves the crystallinity of the piezoelectric layer 15 owing to orientation of those oxides. Thus, the characteristics and reliability of the piezoelectric actuator 1 can be improved.

Figure 4E:
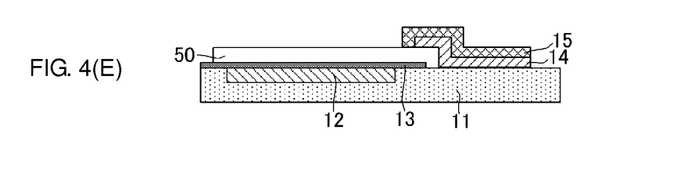

Next, as illustrated in FIG. 4(E), by using sputtering and at a deposition temperature of 400 to 850° C. (typically 700° C.), the piezoelectric layer 15 (dielectric constant $d_{31}$=100 pm/V) made of a KNN (potassium sodium niobate) system is formed by patterning in a predetermined shape by dry etching, at a thickness of 500 nm to 4 μm (typically 2 μm) on the surfaces of the lower electrode 14 and dummy layer 50 (S105). The method of forming the piezoelectric layer 15 may be CVD or PLD, and the patterning may be wet etching. At this time, the patterning is performed in such a way that the piezoelectric layer 15 covers the portion 14ED of the lower electrode 14 which is separated from the base electrode 11. This makes it possible to prevent the upper electrode 16 from coming into contact with the lower electrode 14 when the upper electrode 16 is formed in a subsequent step. As the material of the piezoelectric layer 15, other than the above-mentioned KNN (potassium sodium niobate) system that is a non-lead piezoelectric material, a PZT (lead zirconate titanate), AlN (aluminum nitride), or ZnO (zinc oxide) material may be used. Since the characteristics of and manufacturing methods for these materials as piezoelectric thin films are already well-known, it is easy to form the piezoelectric layer 15 with stable quality. In particular, use of a KNN system can further improve environmental properties as well. Also, by applying annealing at 500° C. to 900° C. such as RTA after forming the piezoelectric layer 15 (before forming the upper electrode 16), the crystallinity, reliability, and piezoelectric characteristics of the piezoelectric can be improved.

Figure 4F:
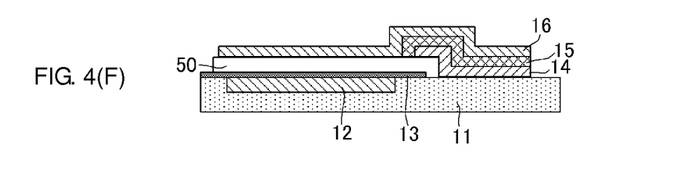

Next, as illustrated in FIG. 4(F), by using an evaporation lift-off method, with It as an adhesion layer, the upper electrode 16 made of Cy is formed by patterning in a predetermined shape by dry etching, at a thickness of 500 nm to 5 μm (typically 2 μm) on the surfaces of the piezoelectric layer 15 and dummy layer 50 (S106). The method of forming the upper electrode 16 may be sputtering or plating, and the patterning may be wet etching. As the material of the upper electrode 16, Au, Ag, Ni, or the like may be used other than Cu. The material may be an alloy system of these metals. Also, the upper electrode 16 may be an Au stacked electrode or the like using a titanium oxide material as the underlying layer. A barrier film of TiN, TaN, TiSiN, or the like may be formed on the electrode made of Cu or the like by sputtering at a thickness of about 100 nm in order to prevent oxidation and diffusion of the Cu or the like of the upper electrode 16. Since the upper electrode 16 is formed in a step later than the formation of the piezoelectric layer 15 which is a high temperature process, a conductive material that is not affected by the deposition process temperature of the piezoelectric layer can be used for the upper electrode 16. This improves the freedom of selection for the material of the upper electrode 16 that is formed over a significantly larger area than the lower electrode 14 and the piezoelectric layer 15. Therefore, it is possible to manufacture the piezoelectric actuator 1 more inexpensively in accordance with the required specifications. Also, the upper electrode 16 makes it possible to adjust the stress generated in the dummy layer 50, the lower electrode 14, and the piezoelectric layer 15 that are formed in preceding steps, by means of the film thickness of the upper electrode 16.

Figure 4G:
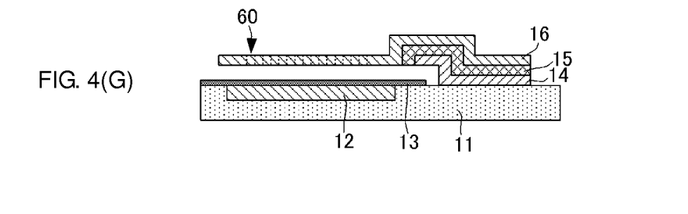

Next, as illustrated in FIG. 4(G), the dummy layer 50 is removed by wet etching (S107). At this time, by providing the upper electrode 16 with the through-holes 60 as illustrated in FIG. 4(G), the speed of wet etching can be improved, thereby enabling improved tact time of the dummy layer removing step.

The piezoelectric actuator 1 is completed through the above-mentioned steps.

While the above-mentioned manufacturing flow is directed to the case where ZnO is used for the dummy layer 50, in a case where polysilicon is used, the dummy layer 50 is deposited by using a low pressure chemical vapor deposition (LPCVD) apparatus at a temperature of about 650° C. Thereafter, after forming the lower electrode 14, the piezoelectric layer 15, and the upper electrode 16, the dummy layer 50 made of polysilicon is removed by, for example, wet etching using TMAH or dry etching using $SF_6$ or $XeF_2$.

Also, in the above-mentioned manufacturing flow, the upper electrode 16 may be formed by plating. In this case, after forming the piezoelectric layer 15, a resist film is formed on the entire surface of this underlying electrode. Then, photolithography is used to pattern a region corresponding to the upper electrode 16, and the resist film of this region is removed. Next, an adhesion layer and a plating seed layer are formed on the entire surface.

Next, a resist film is further formed, a region corresponding to the upper electrode 16 is patterned, and the resist film of this region is removed. Next, by applying electroplating or the like to the opening of the resist film, a Cu plating or Au plating layer is formed at a thickness of 1 μm to 10 μm (typically 3 μm). Thereafter, the plating seed layer and the two resist films sandwiching the plating seed layer are removed, and further, the dummy layer 50 is removed.

The above-mentioned manufacturing flow may include a step of forming an underlying thin film (buffer layer) between the lower electrode 14 and the piezoelectric layer 15. The buffer layer is formed primarily for purposes such as improving the crystallinity (orientation) of the piezoelectric layer, and reducing compressive stress or tensile stress resulting from the difference in thermal expansion coefficient between the lower electrode 14 and the piezoelectric layer 15. As the material of the buffer layer, one of $BaTiO_3$, $SrTiO_3$, $BaZrO_3$, $(Ba, Sr)TiO_3$, and $GdZrO_3$ as an oxide with high dielectric constant, or $LaNiO_3$, $SrRuO_3$, $LaTiO_2N_1$, and $(Sr, La)TiO_xN_y$ as a conductive nitride oxide, or a combination of these is used. As the method of forming the buffer layer, sputtering, evaporation, plating, or the like is used. The thickness of the buffer layer ranges from 1 to 100 nm (typically 10 nm).

Also, in the above-mentioned manufacturing flow, the piezoelectric layer 15 may be formed as a multilayer structure. As the material of the multilayer structure, a combination of the above-mentioned KNN (potassium sodium niobate) system, PZT (lead zirconate titanate) system, AlN (aluminum nitride) system, or ZnO (zinc oxide) system mentioned above, a combination of the same systems, or the like is used. As the method of forming the multilayer structure, sputtering, evaporation, plating, or a combination of these methods is used.

Also, the above-mentioned manufacturing flow may include a step of forming an intermediate layer made of an insulator material or another material between the base substrate and the lower electrode, the lower electrode and the piezoelectric layer, or the piezoelectric layer and the upper electrode.

Figure 5:
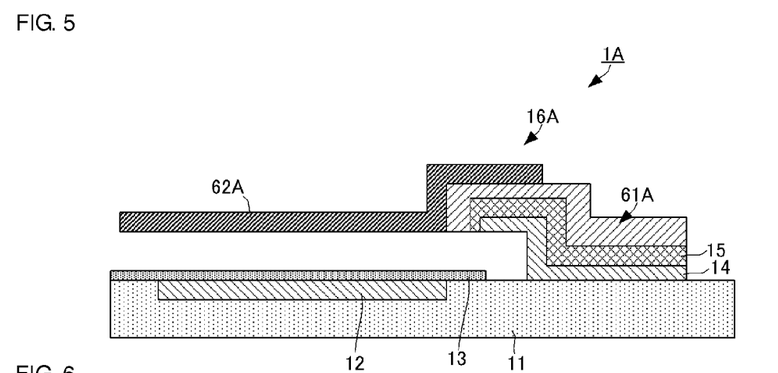
FIG. 5 is a side cross-sectional view of a piezoelectric actuator 1A according to a second embodiment.

Next, a piezoelectric actuator according to a second embodiment is described with reference to a drawing. FIG. 5 is a side cross-sectional view of a piezoelectric actuator 1A according to this embodiment. As opposed to the piezoelectric actuator 1 according to the first embodiment, the piezoelectric actuator 1A according to this embodiment differs in the shape of an upper electrode 16A, and is otherwise the same. Therefore, only the structure of the upper electrode 16A is described. As illustrated in FIG. 5, in the upper electrode 16A of the piezoelectric actuator 1A, a support portion 61A and a movable portion 62A are formed of different materials. In the piezoelectric actuator 1A, one end of the movable portion 62A is formed so as to cover and overlap the support portion 61A. This configuration also makes it possible to attain an operational effect similar to that of the first embodiment, and obtain freedom of design, such as selecting a material that provides excellent adhesion with the piezoelectric layer 15 for the support portion 61A (e.g., Pt), and selecting a material that has excellent electrical conductivity and is inexpensive (such as Cu) for the movable portion 62A.

Figure 6:
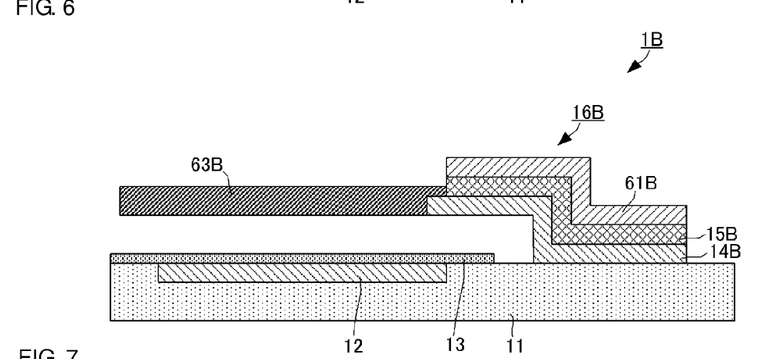
FIG. 6 is a side cross-sectional view of a piezoelectric actuator 1B according to a third embodiment.

Next, a piezoelectric actuator according to a third embodiment is described with reference to a drawing. FIG. 6 is a side cross-sectional view of a piezoelectric actuator 1B according to this embodiment. As opposed to the piezoelectric actuator 1 according to the first embodiment, the piezoelectric actuator 1B according to this embodiment differs in the shapes of a lower electrode 14B, piezoelectric layer 15B, and upper electrode 16B, and is otherwise the same. Therefore, only the structures of the lower electrode 14B, piezoelectric layer 15B, and upper electrode 16B are described.

In plan view of the piezoelectric actuator 1B, the lower electrode 14B and the piezoelectric layer 15B are formed in such a way that an end of the lower electrode 14B protrudes beyond an end of the piezoelectric layer 15B. The upper electrode 16B has only a support portion 61B that is formed only on the surface of the piezoelectric layer 15B. A movable portion 63B is formed so as to connect to the lower electrode 14B. While in the configuration illustrated in FIG. 6 the movable portion 63B is formed at such a thickness that the movable portion 63B does not contact the upper electrode 16B, freedom in the thickness of the movable portion 63B is obtained as long as contact between the upper electrode 16B and the movable portion 63B is avoided by, for example, making an end of the piezoelectric layer 15B protrude beyond an end of the upper electrode 16B. While the movable portion 63B may be formed at any timing after formation of the lower electrode 14B, forming the movable portion 63B after formation of the piezoelectric layer 15B can improve freedom in material selection without having to consider the influence of the formation process temperature of the piezoelectric layer 15B as mentioned above.

Figure 7:
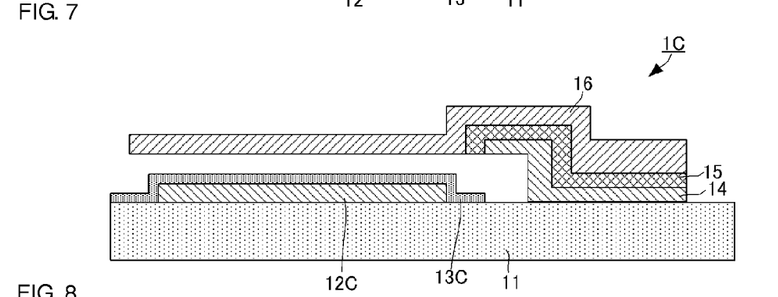
FIG. 7 is a side cross-sectional view of a piezoelectric actuator 1C according to a fourth embodiment.

Next, a piezoelectric actuator according to a fourth embodiment is described with reference to a drawing. FIG. 7 is a side cross-sectional view of a piezoelectric actuator 1C according to this embodiment. As opposed to the piezoelectric actuator 1 according to the first embodiment, the piezoelectric actuator 1C according to this embodiment differs in the position where a fixed electrode 12C is formed, and is otherwise the same. Therefore, only the structure of the fixed electrode 12C is described.

In the piezoelectric actuator 1C, the fixed electrode 12C is formed on the surface of the base substrate 11 having a flat shape. A dielectric layer 13C is formed by patterning in a shape that covers even the fixed electrode 12C. This configuration also makes it possible to attain an operational effect similar to that of the first embodiment.

Figure 8:
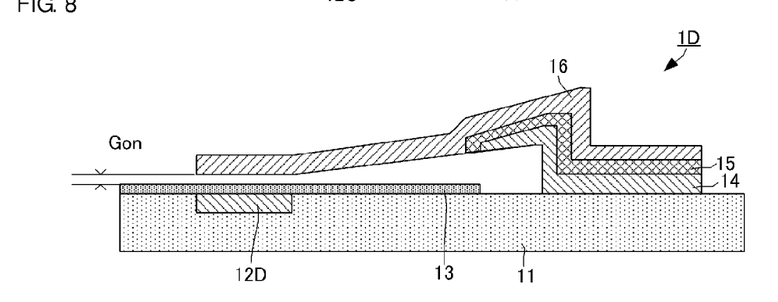
FIG. 8 is a side cross-sectional view of a piezoelectric actuator 1D according to a fifth embodiment.

Next, a piezoelectric actuator according to a fifth embodiment is described with reference to a drawing. FIG. 8 is a side cross-sectional view of a piezoelectric actuator 1D according to this embodiment. The piezoelectric actuator 1D according to this embodiment is of substantially the same structure as the piezoelectric actuator 1 according to the first embodiment. While in FIG. 8 a fixed electrode 12D is formed to have a small area so that the fixed electrode 12D only includes a portion that faces the distal end of the movable portion 62 at a predetermined distance, the fixed electrode 12D may be of the same structure as the fixed electrode 12 according to the first embodiment.

The structure of the piezoelectric actuator 1D is such that, by controlling a drive voltage, the movable portion 62 of the upper electrode 16 is always separated from the fixed electrode 12D and the dielectric layer 13 with a space gap Gon corresponding to the drive voltage. This structure also makes it possible to attain an operational effect similar to that of the first embodiment.

Figure 9:
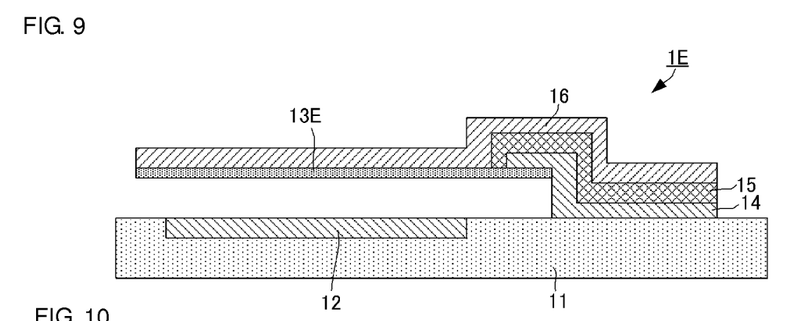
FIG. 9 is a side cross-sectional view of a piezoelectric actuator 1E according to a sixth embodiment.

Next, a piezoelectric actuator according to a sixth embodiment is described with reference to a drawing. FIG. 9 is a side cross-sectional view of a piezoelectric actuator 1E according to this embodiment. As opposed to the piezoelectric actuator 1 according to the first embodiment, the piezoelectric actuator 1E according to this embodiment differs in the structure of a dielectric layer 13E, and is otherwise the same. Therefore, only the structure of the dielectric layer 13E is described.

In the piezoelectric actuator 1E, the dielectric layer 13E is formed so as to be in contact with a portion of the lower electrode 14 separated from the base substrate 11, an end of the piezoelectric layer 15, and the movable portion 62 of the upper electrode 16, that is, the dielectric layer 13E is formed not on the base substrate side but on the movable portion side. Thus, the dielectric layer 13E can reinforce the movable portion 62. This structure also makes it possible to attain an operational effect similar to that of the first embodiment.

Figure 10:
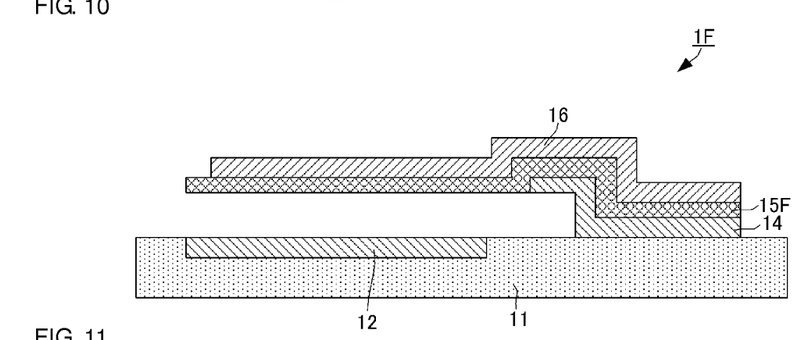
FIG. 10 is a side cross-sectional view of a piezoelectric actuator 1F according to a seventh embodiment.

Next, a piezoelectric actuator according to a seventh embodiment is described with reference to a drawing. FIG. 10 is a side cross-sectional view of a piezoelectric actuator 1F according to this embodiment. As opposed to the piezoelectric actuator 1 according to the first embodiment, the piezoelectric actuator 1F according to this embodiment differs in the structure of a piezoelectric layer 15F.

As illustrated in FIG. 10, the piezoelectric layer 15F of the piezoelectric actuator 1F is formed so as to be longer than the fixed electrode 12 in side view. The upper electrode 16 also serving as the movable portion 62 is formed on substantially the entire surface of the piezoelectric layer 15F. This configuration makes it possible for the piezoelectric layer 15F to double as the dielectric layer 13 mentioned above, thereby making it possible to omit the dielectric layer. Thus, it is possible to form a piezoelectric actuator with an even simpler configuration.

Figure 11:
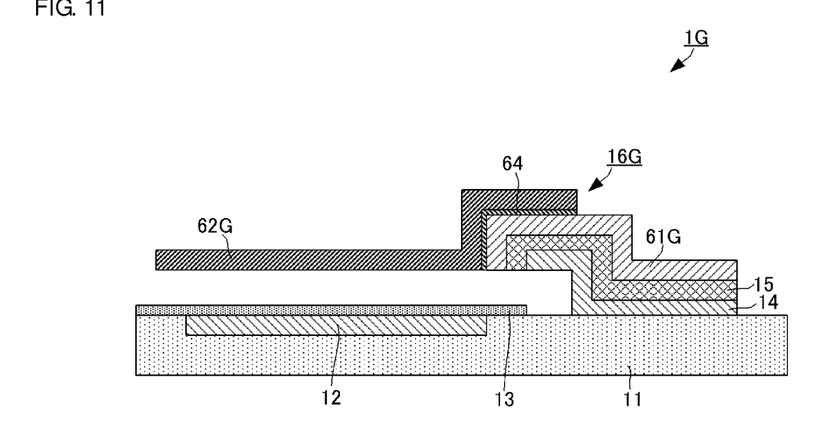
FIG. 11 is a side cross-sectional view of a piezoelectric actuator 1G according to an eighth embodiment.

Next, a piezoelectric actuator according to an eighth embodiment is described with reference to a drawing. FIG. 11 is a side cross-sectional view of a piezoelectric actuator 1G according to this embodiment. As opposed to the piezoelectric actuator 1A according to the second embodiment, the piezoelectric actuator 1G according to this embodiment differs in the structure of an upper electrode 16G.

In the upper electrode 16G of the piezoelectric actuator 1G, an insulator layer 64 is formed between a support portion 61G and a movable portion 62G. This configuration enables electrical isolation between the support portion 61G and the movable portion 62G. As the material of the insulator layer 64, not only an insulator material such as glass or ceramics, but also the above-mentioned dielectric material, piezoelectric material, semiconductor material, or the like can be also used. For example, it is possible to use the support portion 61G for application of a drive voltage, and use the movable portion 62 for transmission of high frequency signals.

While the above embodiments are directed to the case of making the upper electrode for applying a drive voltage double as the movable electrode for high frequency signals, simplification of the structure is also possible by extending the lower electrode for applying a drive voltage so that the lower electrode doubles as the movable electrode for high frequency signals.

REFERENCE SIGNS LIST 1, 1A to 1G piezoelectric actuator
11 base substrate
12, 12C, 12D fixed electrode
13, 13C dielectric layer
14, 14B lower electrode
15, 15B, 15F piezoelectric layer
16, 16A, 16B, 16G upper electrode
14V, 15V, 16V bending portion
60 through-holes
61, 61A, 61G support portion
62, 62A, 62G movable portion
63B movable portion
64 insulator layer

The invention claimed is:

1. A piezoelectric actuator comprising:
a base substrate that has an insulating property;
a fixed electrode adjacent the base substrate;
a first electrode at least partially separated from the base substrate;
a piezoelectric layer adjacent a side of the first electrode opposite to the base substrate; and
a second electrode on a side of the piezoelectric layer opposite to the first electrode,
wherein only a portion of one of the first or second electrode defines a movable electrode portion whose distance to the fixed electrode varies as the piezoelectric layer is distorted by application of a piezoelectric drive voltage to the first electrode or second electrode.

2. The piezoelectric actuator according to claim 1, wherein a first end of the movable electrode portion is supported by a stacked structure portion that includes the first electrode, the piezoelectric layer, and the second electrode.

3. The piezoelectric actuator according to claim 2, further comprising an insulating layer between the moveable electrode portion and the stacked structure portion.

4. The piezoelectric actuator according to claim 1, wherein the movable electrode portion is defined by the second electrode.

5. The piezoelectric actuator according to claim 1, further comprising a dielectric layer between the fixed electrode and the movable electrode portion.

6. The piezoelectric actuator according to claim 5, wherein a portion of the piezoelectric layer comprises the dielectric layer.

7. The piezoelectric actuator according to claim 5, wherein the dielectric layer is in contact with the fixed electrode.

8. The piezoelectric actuator according to claim 5, wherein the dielectric layer is in contact with the moveable electrode portion.

9. The piezoelectric actuator according to claim 1, wherein an area of the movable electrode portion located in proximity to the fixed electrode varies with an amount of distortion of the piezoelectric layer.

10. The piezoelectric actuator according to claim 1, wherein the fixed electrode and the movable electrode portion are connected to a transmission line that transmits a high frequency signal, or are connected between the transmission line and a ground line.

11. The piezoelectric actuator according to claim 1, wherein the piezoelectric layer comprises a lead zirconate titanate, aluminum nitride, or zinc oxide material.

12. The piezoelectric actuator according to claim 1,
wherein the piezoelectric layer comprises a potassium sodium niobate material represented by $(K_{1-a-b}Na_aA_b)(Nb_{1-c}B_c)O_3$,
wherein A is at least one compound selected from the group consisting of Li, Ag, Ca, Sr, Bi, and Gd; B is at least one compound selected from the group consisting of Ta, Zr, Ti, Al, Sc, and Hf; $0 \leq a \leq 0.9$; $0 \leq b \leq 0.3$; $0 \leq a+b \leq 0.9$; and $0 \leq c \leq 0.3$.

13. The piezoelectric actuator according to claim 1,
wherein the piezoelectric layer comprises a potassium sodium niobate material having not more than 10 mol % of at least one kind of metal or oxide selected from the group consisting of Mn, Mg, Zn, Fe, Cu, and Yb added to $(K_{1-a-b}Na_aA_b)(Nb_{1-c}B_c)O_3$,
wherein A is at least one compound selected from the group consisting of Li, Ag, Ca, Sr, Bi, and Gd; B is at least one compound selected from the group consisting of Ta, Zr, Ti, Al, Sc, and Hf; $0 \leq a \leq 0.9$; $0 \leq b \leq 0.3$; $0 \leq a+b \leq 0.9$; and $0 \leq c \leq 0.3$.

14. The piezoelectric actuator according to claim 1, wherein the base substrate is one of LTCC, glass, SOI, alumina ceramics, $LiNbO_3$, $LiTaO_3$, quartz crystal, Si, sapphire, GaAs, GaN, Ge, and SiC.

15. The piezoelectric actuator according to claim 1, further comprising a plurality of through holes in the moveable electrode portion.

16. A piezoelectric actuator comprising:
a base substrate that has an insulating property;
a fixed electrode adjacent the base substrate;
a first electrode at least partially separated from the base substrate;
a piezoelectric layer adjacent a side of the first electrode opposite to the base substrate; and
a second electrode on a side of the piezoelectric layer opposite to the first electrode,
wherein at least a portion of the first or second electrode defines a movable electrode portion whose distance to the fixed electrode varies as the piezoelectric layer is distorted by application of a piezoelectric drive voltage to the first electrode or second electrode, and
wherein the fixed electrode is embedded in the base substrate.

17. A piezoelectric actuator comprising:
a base substrate that has an insulating property;
a fixed electrode adjacent the base substrate;
a first electrode at least partially separated from the base substrate;
a piezoelectric layer adjacent a side of the first electrode opposite to the base substrate; and
a second electrode on a side of the piezoelectric layer opposite to the first electrode,
wherein at least a portion of the first or second electrode defines a movable electrode portion whose distance to the fixed electrode varies as the piezoelectric layer is distorted by application of a piezoelectric drive voltage to the first electrode or second electrode, and wherein the portion of the first or second electrode that defines the moveable electrode portion is a different material than a remaining portion of the first or second electrode that does not define the moveable electrode portion.

* * * * *